United States Patent [19]

Edwards

[11] 4,422,048
[45] Dec. 20, 1983

[54] MULTIPLE BAND FREQUENCY RESPONSE CONTROLLER

[76] Inventor: Richard K. Edwards, 784 Austin Ave., Oradell, N.J. 07649

[21] Appl. No.: 401,108

[22] Filed: Jul. 23, 1982

Related U.S. Application Data

[63] Continuation-in-part of Ser. No. 121,596, Feb. 14, 1980, abandoned.

[51] Int. Cl.³ .......................... H03F 1/34; H03F 3/181
[52] U.S. Cl. ...................................... 330/109; 330/84; 330/85; 330/126; 333/28 T
[58] Field of Search ................ 330/84, 126, 107, 109, 330/304, 306, 85; 333/28 R, 28 T

[56] References Cited

U.S. PATENT DOCUMENTS 3,750,044  7/1973  Stanley ........................... 330/126

Primary Examiner—James B. Mullins

[57] ABSTRACT

A multiple band frequency response controller for use in audio applications, to precisely control and equalize audio system response. The frequency response controller shown will adjust response in ten octave bands. The unique feedback system used will generate response curves of increased smoothness and accuracy. In addition, the method shown will be readily adaptable to external control by analog or digital control signals.

22 Claims, 6 Drawing Figures

MULTIPLE BAND FREQUENCY RESPONSE CONTROLLER

This application is a continuation-in-part of application Ser. No. 06/121,596 filed Feb. 14, 1980, and now abandoned.

BACKGROUND OF THE INVENTION

Multiple band frequency response controllers have applications in many fields of electronics; however, their area of primary use is in audio signal processing. When used in the audio field, these devices are usually referred to as "equalizers", as they are often used to equalize system frequency response by compensating for frequency response aberrations of other devices in the audio signal processing chain. Such equalizers usually control a number of bands of more or less fixed frequency and bandwidth, and often use slide-type controls to set individual band response. These are known as "graphic equalizers" because the positions of the slide controls graphically represent the response curve of the device.

Many graphic equalizers are commercially available. These existing designs are generally subject to the following problems: 1. The response at the center of the control band usually only approximates the desired response level, due to the often extensive interaction between the setting of one control band and the control bands surrounding it. 2. Response between the central points of the control bands often is not smooth and shows a large amount of "ripple". 3. The effective control bandwidth often tends to vary with the setting of the control. 4. The design of the device often represents a compromise between accurate response, smoothness of response, and signal-to-noise ratio.

Therefore, an object of this invention is to provide a multiple band frequency response controller capable of generating response curves of increased smoothness and accuracy.

An additional object of this invention is to provide a multiple band frequency response controller with increased signal-to-noise ratio.

SUMMARY OF THE INVENTION

The invention described herein is a multiple band frequency response controller using an overall feedback system configuration, comprising a plurality of variable voltage dividers, a plurality of bandpass filters, and a unique signal matrix processor within the feedback system, capable of generating signals to drive the bandpass filters in such a manner as to obtain smooth, accurate response curves.

BASIC COMPONENTS OF THE INVENTION

Figure 1:
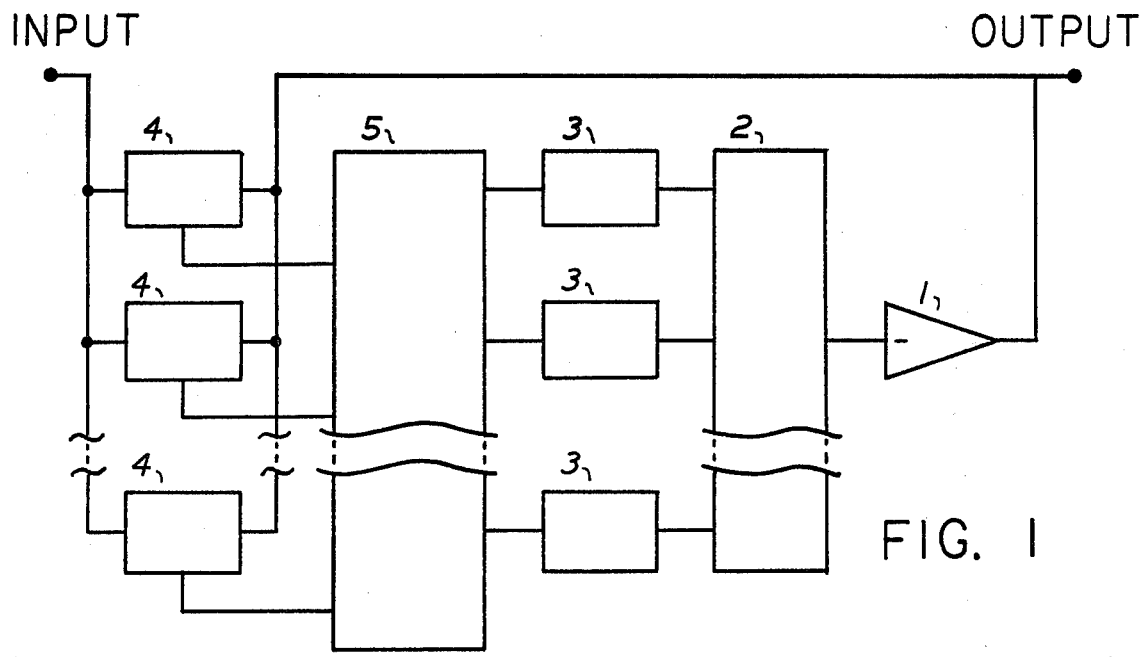
FIG. 1 illustrates the components of the invention in its most basic form.

FIG. 1 is a block diagram of the components which constitute the invention in its most basic form. These components are: 1. A high gain, inverting operational amplifier, 2. A multiple input scaling adder, 3. A group of bandpass filters, 4. A group of variable voltage dividers, each connected between two signal busses representing the system's input and output signals, which will act to set the gain for the center of each control band, and 5. A signal matrix processor, the function of which is to derive from the set of signals provided by the variable voltage dividers a second set of signals appropriate to serve as input signals to the bandpass filters. These components essentially form a negative feedback system, in which the subsystem formed by the variable voltage dividers, signal matrix processor, bandpass filters, and the scaling adder work together to provide a signal to the inverting input of the operational amplifier, such that the system as a whole forms an inverting amplifier. It is the operation of the subsystem, specifically, the parameters of the transfer function of the output of the scaling adder relative to the input and output signal busses, that determines the characteristics of the system.

In order for the system to meet its design objectives of smooth and accurate response, appropriate parameters must be selected for the bandpass filters and for the signal matrix processor.

Ideal bandpass filters for use in this system would possess frequency response characteristics in which the response of each filter would roll off smoothly and gradually and with minimal phase shift in the frequency regions between the filter's center frequency and the center frequencies of the adjacent filters, so as to provide the system as a whole with smooth frequency response curves without unevenness between center frequencies, and in which response would be minimal at the center frequencies of the adjacent filters and beyond, so as to minimize the effect of each frequency band control on surrounding frequency bands and thereby provide maximum control setting accuracy.

As a practical matter, real bandpass filters located on frequency intervals on the order of one octave or less can not simultaneously meet all of these criteria.

The use of filters having very narrow bandwidths in an attempt to minimize filter response in surrounding control bands is unacceptable in that the response of the filter group at frequencies between band center frequencies would be significantly less than the response at band center frequencies, due to individual filter response drop off as well as significant mutual cancellation of filter outputs due to phase shift. This would result in uneven overall system response between control band center frequencies.

To provide smooth response curves without unevenness in the areas between band center frequencies, the bandwidth of the filters used must be made wide enough to avoid sudden response drop off and excessive phase shift in the areas between band center frequencies. However, such filters will invariably exhibit significant response at the center frequencies of surrounding control bands. This extraneous response, if not counteracted, would lead to significant loss of control setting accuracy.

It is the function of the signal matrix processor to transfer control signals from the individual band controls to the individual band filters, while at the same time altering those signals as required to counteract possible errors to control settings caused by the responses of the filters of the surrounding control bands.

The implementation of the signal matrix processor shown here will consist of a group of scaling adders in which the input scaling factors will be precisely set so as to counteract errors in control setting action and thereby provide accurate control response.

The design of the signal matrix processor is critical to the invention. The purpose of the signal matrix processor is to provide to the bandpass filter elements appropriate signals such that at the center of each control frequency band, the system's gain will accurately reflect the desired gain for that frequency as set by the voltage ratio established by the voltage divider for that frequency band. To do this, the following criterion must be met: the transfer function defined by the output of the scaling adder with respect to the signals present on the input and output signal busses must, at each control band center frequency, be substantially proportional to the transfer function defined by the output of the variable voltage divider for that frequency band with respect to the signals present on the input and output signal busses. When this criterion is met, due to the action of the operational amplifier in its negative feedback mode, the ratio of the output voltage to the input voltage will be equal to the ratio of the input buss transfer function to the output buss transfer function, which, at each band center frequency, will be substantially proportional to the transfer function ratio set by that band's variable voltage divider. Therefore, at each band's center frequency, the system gain will be proportionate to the setting of that band's voltage divider.

As an example, where any one of the voltage dividers is set to provide a transfer function equal to 80 percent of the voltage present on the input signal buss plus 20 percent of the voltage present on the output signal buss, the overall system gain at the center frequency of that voltage divider's control band will be equal to 0.8 divided by 0.2, or 4.

The design of this system is greatly simplified by causing all of the bandpass filter elements to have the same relative bandwidth (and gain), and by setting the control band center frequencies at logarithmically equidistant intervals. The design process may be further simplified by computing system parameters as though there were an infinite number of control bands involved having center frequencies extending from zero to infinity. Under these circumstances, all control bands may be considered as requiring identical treatment in the signal matrix processor. In practice, the response components contributed to the total response of the filter bank at any one control band center frequency by the surrounding bandpass filters diminishes greatly as those filters get further away in frequency; therefore, the number of filters actually used in design calculations may be limited to a number large enough so that errors due to the omission of filters outside the limits will be, for practical purposes, negligible.

Ideally, the transfer function generated by the signal matrix processor should be designed based on both the real and imaginary components of the bandpass filters' responses; however, the imaginary components in the sum of filters' responses largely tend to cancel (as least as far as signal matrix processor design is concerned) due to the symmetrical nature of the responses. Therefore, the signal matrix processor can be designed taking into account only the real responses of the filter bank.

The parameters required for proper operation of the signal matrix processor may be determined by means of matrix mathematics.

The sum of the real responses of the individual filters generated at the output of the scaling adder may be expressed, where n represents the number of filter elements used for calculations, in the form of an n by n matrix G, in which element $G(i,j)$ represents the real response of filter (i) at center frequency (j) with respect to the output of the scaling adder. To provide uniformity in calculations, the filter gains should be normalized so that the sum of the real responses of any one filter at all center frequencies involved will be equal to one.

The operation of the group of scaling adders comprising the signal matrix processor may also be expressed in the form of an n by n matrix M in which element $M(i,j)$ represents the gain at output (j) with respect to input (i). Outputs (1) through (n) of the signal matrix processor are connected to the inputs of filters (1) through (n) respectively; therefore, the real response at the output of the scaling adder with respect to any input (i) of the signal matrix processor at frequency (j) will be equal to the sum of the products of signal matrix processor outputs (1) through (n) as a function of signal matrix processor input (i) multiplied by the real responses of filters (1) through (n) at frequency (j). Therefore, matrix MG, the product of matrices M and G, will represent the sum of the real responses of all the filters appearing at the output of the scaling adder at frequency (j) with respect to input (i) of the signal matrix processor.

Ideally, the output of the scaling adder at any one filter center frequency would exhibit unity gain with respect to that input of the signal matrix processor corresponding to the filter for that center frequency, and zero response with respect to the other inputs of the signal matrix processor. This criterion as expressed in the form of matrix MG requires that elements $MG(i,j)$ where $i=j$ be equal to one and that all other elements be equal to zero. Such a matrix, in which those elements located along its main diagonal are equal to one and in which all other elements are equal to zero, is defined as the identity matrix.

The design of the signal matrix processor then requires that the matrix M be established such that the product of matrices M and G will equal the identity matrix. Any matrix multiplied by its inverse equals the identity matrix; therefore, the matrix M may be determined as the inverse of matrix G. Therefore the signal matrix processor may be implemented as a group of scaling adders in which the gain of output (j) with respect to input (i) is represented by matrix element $M(i,j)$.

To accurately implement a matrix such as this using a number of scaling adders would require, for a system with n control bands, in excess of n squared resistors. For a ten band system, this would require in excess of 100 resistors for the matrix function. For purposes of simplicity and economy, a simpler matrix may be desired. For the octave-band equalizer shown in the preferred embodiment, in which the bandpass filters used had a nominal Q of 1.125, a coefficient set of . . . +0.0001, −0.0049, +0.0300, −0.4774, +1.9042, −0.4774, +0.0300, −0.0049, +0.0001, . . . was found to be required (that is, matrix elements $M(x,x)$ are equal to +1.9042, matrix elements $M(x,x-1)$ and $M(x,x+1)$ are equal to −0.4774, matrix elements $M(x,x-2)$ and $M(x,x+2)$ are equal to +0.0300, and so on). However, empirical testing showed that in this case, use of a coefficient set of the form . . . 0, 0, 0, $-k$, $1+2k$, $-k$, 0, 0, 0, . . . with values of . . . 0, 0, 0. $-0.4444$, $+1.888$, $-0.4444$, 0, 0, 0, . . . could be used (that is, matrix elements $M(x,x)$ are equal to $1+2k$, matrix elements $M(x,x-1)$ and $M(x,x+1)$ are equal to $-k$, matrix elements $M(x,x-2)$ and $M(x,x+2)$ are equal to 0, and so on), resulting in response errors of only one to three percent, thus greatly simplifying design of the circuitry.

Figure 2:
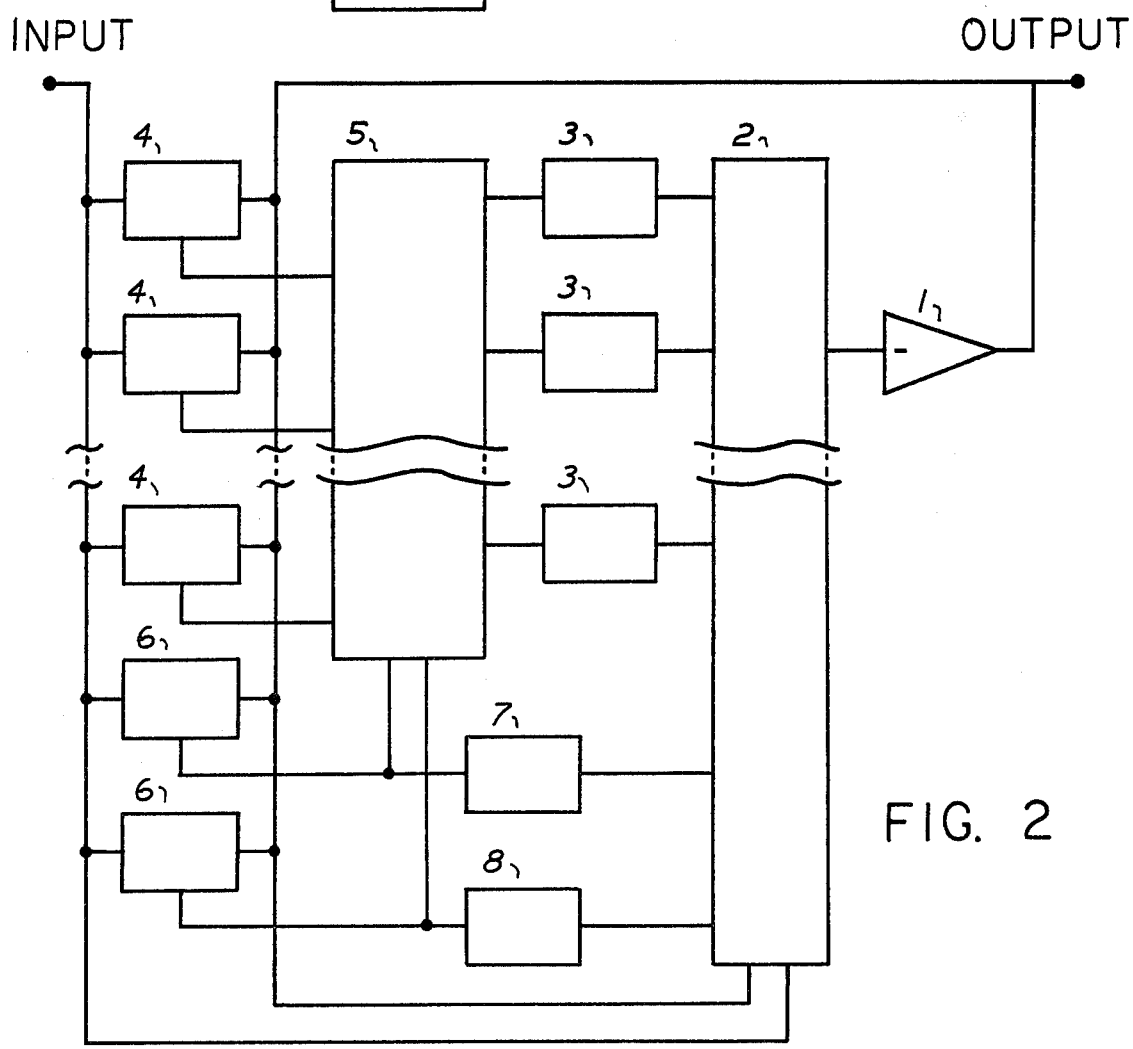
FIG. 2 illustrates the components of the invention in its more advanced form.

FIG. 2 is a block diagram of the components which constitute the invention in its more complete form. The components, in addition to those shown in FIG. 1, are: 6. A pair of voltage dividers, connected between the input and output signals busses, 7. A low pass filter, and 8. A high pass filter, the inputs of the two filters being connected to the two voltage dividers, and the outputs of the filters being connected to additional inputs of the scaling adder. The configuration shown in FIG. 2 also differs from FIG. 1 in that additional inputs have been provided to the signal matrix processor to accept signals from the voltage dividers for the low pass and high pass filters. Additional inputs have also been provided in the scaling adder to accept signals directly from the input and output signal busses. The purpose of the low pass and high pass filters is to add to the transfer function of the group of bandpass filters the approximate equivalent to the sums of the transfer functions of additional bandpass filter elements that would be located below and above the range of bandpass filter elements actually used. By so simulating the presence of additional bandpass filter elements, imaginary components in the sum of the filter group's transfer function are largely cancelled, thus enabling more accurate and symmetrical response in the extreme upper and lower frequency control bands.

The purpose of the connections of the voltage dividers for the low pass and high pass filters to additional inputs of the signal matrix processor also relates to maintaining accuracy in the extreme upper and lower frequency control bands, specifically to enable the signal matrix processor to provide signals to upper-end and lower-end bandpass filters sufficient to anticipate any changes in response levels that would otherwise be caused by the addition to the overall filter system of the real components of the response of the low pass and high pass filters.

The purpose of the additional inputs in the scaling adder which accept signals directly from the input and output signal busses relates to overall smoothness of response. The use of bandpass filters with narrow bandwidths can result in "ripples" in the response curve caused by imaginary components of the filter group's transfer function. The introduction of signals to the scaling adder directly from the input and output signal busses to supplement the signals from the filter group increases the relative magnitude of the real response components and thus decreases the significance of the imaginary components.

It should be noted that the introduction of these additional signals, while increasing smoothness of response for some control settings, in particular for areas of rising or falling slopes on the response curve, may have the effect of reducing smoothness of response for some other control settings, in particular for areas of uniform high or low gain.

With the additional input signals provided directly to the scaling adder from the input and output signal busses, the system's overall gain at any one band center frequency becomes proportional to the ratio of that control's transfer function with respect to the input signal buss plus the effective relative transfer function with respect to the input signal buss provided by the additional input to the scaling adder divided by that control's transfer function with respect to the output signal buss plus the effective relative transfer function with respect to the output signal buss provided by the additional input to the scaling adder. As an example, where any one of the voltage dividers is set to provide a transfer function equal to 100 percent of the voltage present on the input signal buss plus 0 percent of the voltage present on the output signal buss, and the effective transfer function of the additional inputs to the scaling adder with respect to the input and output signal busses is 0.3333 (relative to the transfer function exhibited by the signal matrix processor and bandpass filter group at any one band center frequency), the overall system gain at the center frequency of that voltage divider's control band will be equal to $1+0.3333$ divided by $0+0.3333$, or approximately 4.

As shown here, the system is capable of providing symmetrical gain increase and decrease for each control band. However, by the use of variable transfer function means responsive either to signals only on the input buss or only on the output buss, the system may be set up to provide only gain increase or only gain decrease, respectively. As an example, where the variable transfer function means are responsive only to signals on the output buss, overall system gain at any one band center frequency will be proportional to the ratio of the transfer function with respect to the input signal buss exhibited by the additional input of the scaling adder divided by that control's transfer function with respect to the output signal buss plus the effective transfer function with respect to the output signal buss provided by the additional input to the scaling adder.

Figure 4:
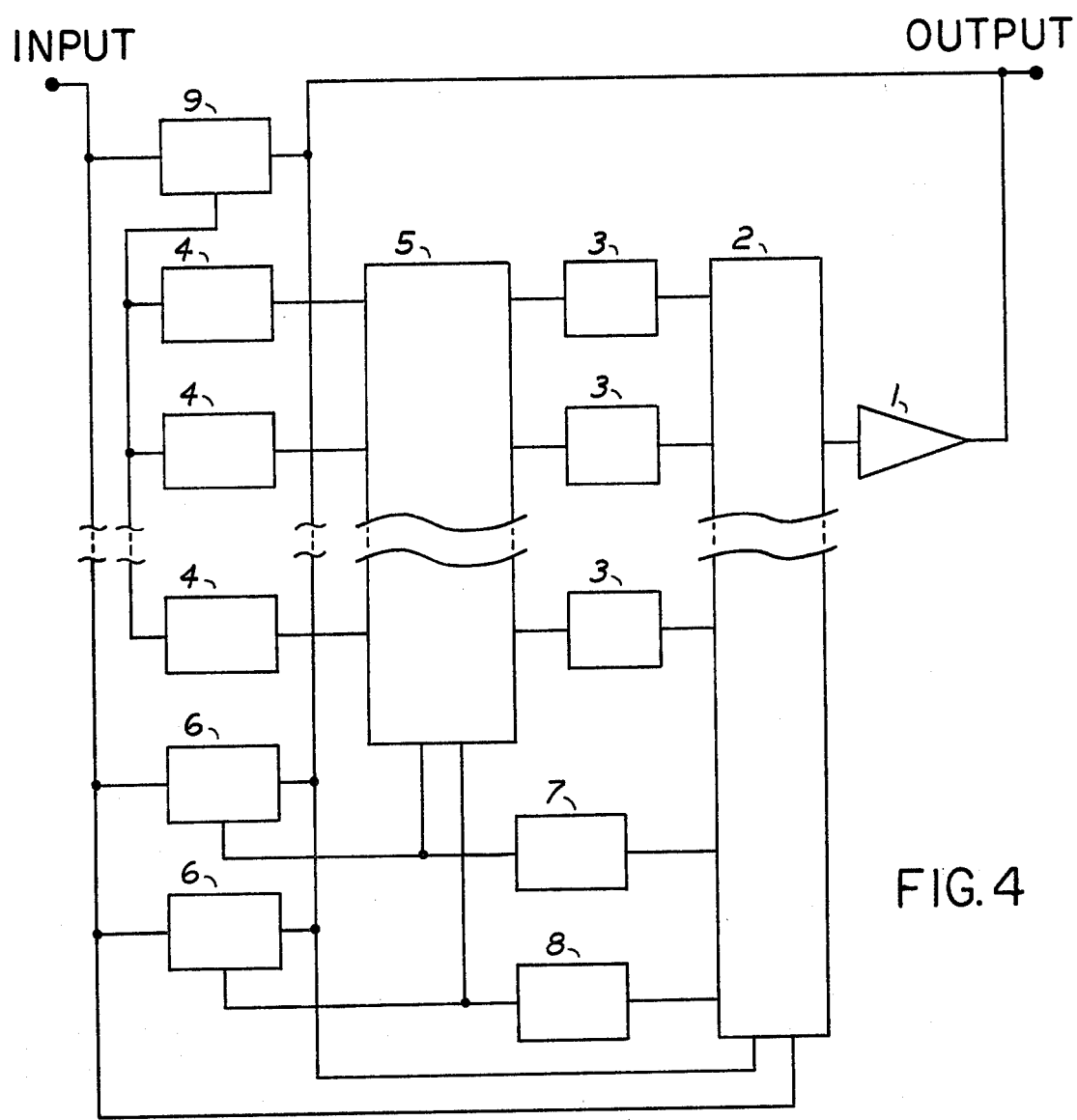
FIG. 4 illustrates a variation of the system shown in FIG. 2.

The system shown in FIG. 4 is a variation of the system as shown in FIG. 2. The additional component here is: 9. A differential input amplifier, the function of which is to provide to the group of variable function means a signal representing the difference between the input and output signal busses. Where only one such signal is provided, the variable transfer function means must be capable of providing both a positive and a negative transfer function (that is, it must be capable of providing both a non-inverting and an inverting transfer function) in order to provide both gain increase and decrease for each control band. Alternatively, the differential amplifier may be configured to provide both non-inverting and inverting outputs for use with dual-input variable transfer function means. To provide a system capable of only gain increase or only gain decrease, a single output of the differential amplifier may be used with variable transfer function means capable of providing only a positive or only a negative transfer function.

As in the system shown in FIG. 2, overall system gain is a function of a total transfer function ratio between the input and output signal busses. As an example, where any one of the voltage dividers is set to provide a transfer function equal to 100 percent of the voltage present on the input signal buss plus $-100$ percent of the voltage present on the output signal buss, and the effective transfer function of the additional inputs to the scaling adder with respect to the input and output signal busses is 1.6666 (relative to the transfer function exhibited by the signal matrix processor and bandpass filter group at any one band center frequency), the overall system gain at the center frequency of that voltage divider's control band will be equal to 1+1.6666 divided by −1+1.6666, or approximately 4.

The system shown in FIG. 4, in contrast to the system shown in FIG. 2, requires a significantly higher transfer function for the additional inputs of the scaling adder in order to provide an equivalent gain control range. As a result, the magnitude of the real response components presented to the scaling adder is significantly increased relative to the magnitude of the imaginary components. The effect of this is to further increase the smoothness of response for some control settings, in particular for rising or falling slopes of the response curve, while reducing smoothness of response for other control settings, in particular for areas of uniform high or low gain.

The systems shown in FIG. 1, FIG. 2, and FIG. 4, while employing somewhat differing component configurations, all function according to the same basic mathematical relationships. In all cases, overall system gain is a function of a transfer function ratio established between the input and output signal busses generated by a group of variable transfer function means responsive to one or two signal lines representing some function of the input and output signals present. Three basic configurations with three sets of parameters have been shown. In practice, various system configurations similar to those shown here with parameters selected from a practically unlimited range may be employed. As a result, in all cases, the operating parameters required of the signal matrix processor are essentially the same: to provide a signal at the output of the scaling adder which, for each band center frequency, is substantially proportional to the signal applied to the corresponding input of the signal matrix processor for that frequency band, without regard to the signals present at the other signal matrix processor inputs.

PREFERRED EMBODIMENT OF THE INVENTION

Figure 3:
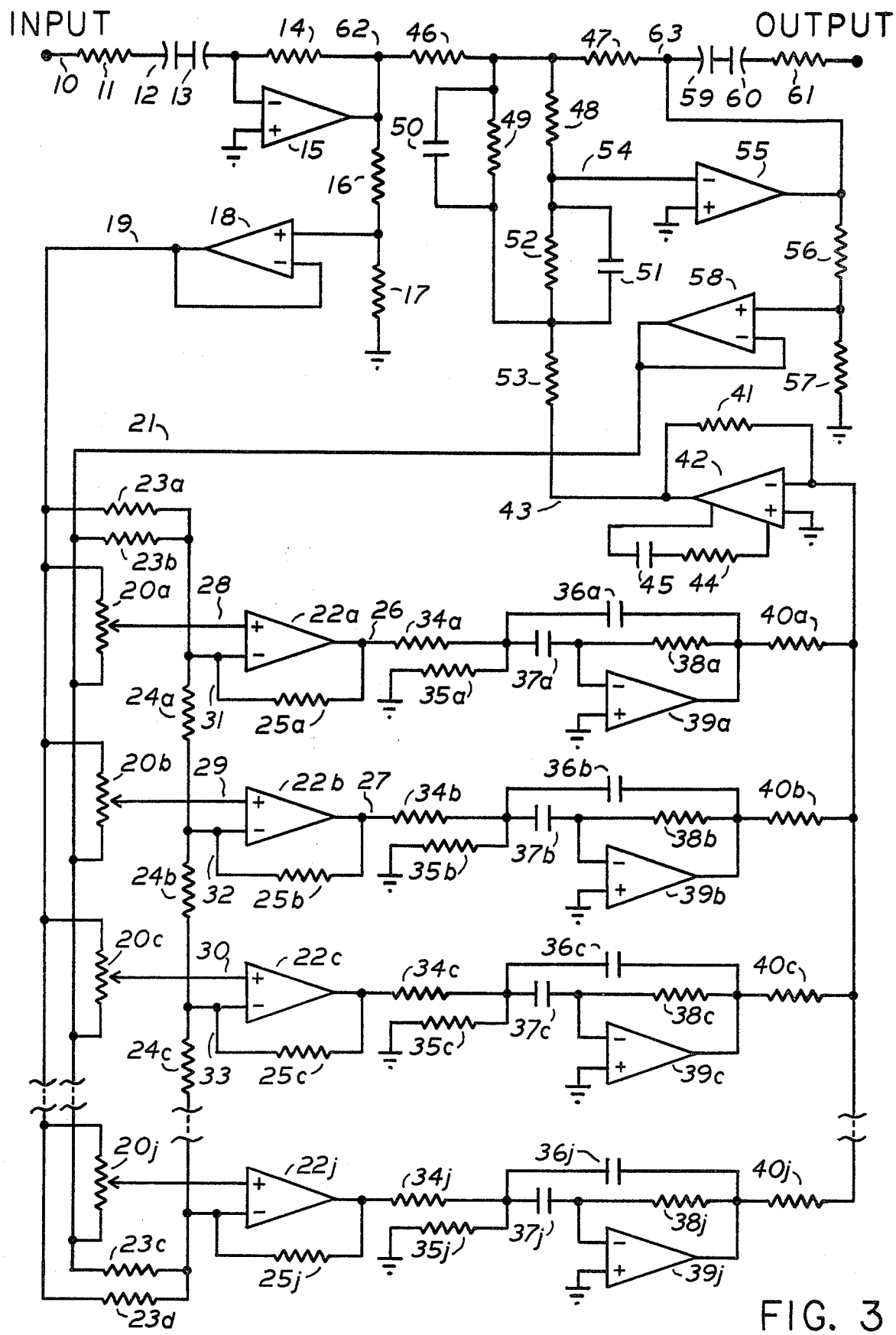
FIG. 3 is a complete schematic diagram of the preferred embodiment of the invention.

FIG. 3 is a complete schematic diagram of the preferred embodiment of the invention, designed for the following specifications: ten frequency control bands with band center frequencies of approximately 32 Hz to 16 kHz on approximately one octave (frequency factor of two) intervals, and a control range of approximately plus and minus 12 db. A detailed description of the components is as follows:

Input signals are applied to input 10. These signals are impedance-buffered by the unity-gain inverting amplifier formed by resistor 11, capacitors 12 and 13, resistor 14, and operational amplifier 15. Capacitors 12 and 13 perform a DC blocking function. Resistors 16 and 17 act as a voltage divider to reduce the voltage applied by unity-gain operational amplifier 18 to the input signal buss 19. This voltage reduction is necessary to avoid internal overvoltage limiting. The band-gain control potentiometers, 20a through 20j, serve to set the gain for each frequency band relative to the input signal buss 19 and the output signal buss 21. Operational amplifiers 22a through 22j in conjunction with resistors 23a through 23d, resistors 24a through 24i, and resistors 25a through 25j provide the signal matrix function required to provide signals to the bandpass filter elements as a function of the signals generated by potentiometers 20a through 20j.

The action of the signal matrix processor may be illustrated by observing the voltages present at points 26 and 27 generated at the outputs of operational amplifiers 22a and 22b, respectively as a function of voltages 19, 21, 28, 29, and 30. Operational amplifiers 22a through 22j will, by their nature, cause the voltages at their inverting input to almost equal the voltages applied to their non-inverting inputs; therfore, voltages 31, 32, and 33 may be considered to be equivalent to the voltages 28, 29, and 30. Therefore, it can be seen that operational amplifier 22b functions as a differential input scaling adder, and that, where where V27, V28, V29, and V30 represent the voltages present at points 27, 28, 29, and 30 and R24a, R24b, and R25b represent resistors 24a, 24b, and 25b, $$V27 = V29 + ((V29 - V28)(R25b/R24a)) + ((V29 - V30)(R25b/R24b))$$

thus providing that, where k represents R25/R24 (all R25's being equal and all R24's being equal), $$V27 = V29 + k(V29 - V28) + k(V29 - V30)$$

or $$V27 = (1+2k)V29 - kV28 - kV30$$

thus establishing the operation of the signal matrix processor in accordance with the ... 0, 0, 0, −k, 1+2k, −k, 0, 0, 0 ... coefficient set described above.

Likewise it can be seen that, where V26, V28, and V29 represent the voltages present at points 26, 28, and 29, where Vm represents the voltage midway between the voltages present at points 19 and 21, where R24a and R25a represent resistors 24a and 25a, and where R23 represents resistor 23a or 23b, these two having equal values, $$V26 = V28 + ((V28 - V29)(R25a/R24a)) + ((V28 - Vm)(R25a/(R23/2)))$$

thus providing that, where k1 represents R25/R24 and k2 represents R25/(R23/2), $$V26 = V28 + k1(V28 - V29) + k2(V28 - Vm)$$

or $$V26 = (1+k1+k2)V28 - k1V29 - k2Vm.$$

(This is based on the fact that resistors 23a and 23b have equal values; therefore, the signal provided by them can be considered as representing a voltage midway between voltages 19 and 21, at an impedance equal to the two equal resistors in parallel.) The k2 factor here is representative of the function provided by the additional inputs to the signal matrix processor from the voltage dividers for the high pass and low pass filters as shown in FIG. 2. Specifically, its function is to enable the signal matrix processor to provide signals to upper-end and lower-end bandpass filters sufficient to anticipate any changes in response levels that would otherwise be caused by the addition to the overall filter system of the real components of the response of the low pass and high pass filters. Operational amplifiers 22c through 22i will function in like manner to operational amplifier 22b; operational amplifier 22j will function in like manner to operational amplifier 22a.

Resistors 34a through 34j and 35a through 35j, capacitors 36a through 36j and 37a through 37j, resistors 38a through 38*j* and operational amplifiers 39*a* through 39*j* form the ten bandpass filter elements.

Resistors 40*a* through 40*j*, resistor 41, and operational amplifier 42 form a scaling adder, generating a voltage at point 43 which represents (in inverted phase) the sum of the output voltages of the bandpass filters, multiplied by the ratio of resistor 41 divided by any resistor 40 (all resistors 40*a* through 40*j* being equal). Resistor 44 and capacitor 45 provide phase compensation for operational amplifier 42.

Resistors 46, 47, 48, and 49, capacitors 50 and 51, and resistors 52 and 53 form a circuit matrix whose function is to provide at point 54, the inverting input of operational amplifer 55, a signal which is proportionally representative of the total signal produced by the scaling adder 2 in FIG. 2. Because of the nature of the feedback system established by operational amplifier 55, the transfer function in the preferred embodiment need only be proportional to, and not necessarily equal to, the transfer function designated in FIG. 2. The values of capacitors 50 and 51 have been chosen so that near the center of the system's frequency control range, the impedance of capacitor 50 will be very high relative to resistor 49 and the impedance of capacitor 51 will be very low and will effectively shunt resistor 52. Under these circumstances, the voltage at point 54 will effectively be that created by a voltage divider, one end of which is connected to the output of the scaling adder, point 43, through resistor 53, and the other end of which is effectively connected to a point midway (resistors 46 and 47 being equal) between the input and output signal busses (represented, in increased magnitude, by points 62 and 63) by a resistance equal to resistors 48 and 49 in parallel plus resistors 46 and 47 in parallel. This effectively implements the transfer function designated in FIG. 2. At frequencies near the bottom of the system's frequency control range, the impedance of capacitor 51 rises, thereby increasing the transfer function to point 54 of the input and output busses relative to the sum of the bandpass filters, and thus performing a function analogous to the low pass filter shown in FIG. 2. At frequencies near the top of the system's frequency control range, the impedance of capacitor 50 falls, effectively shunting resistor 49, thereby increasing the transfer function to point 54 of the input and output signal busses relative to the sum of the bandpass filters, and thus performing a function analogous to the high pass filter shown in FIG. 2.

Resistors 56 and 57 act as a voltage divider to reduce the voltage applied by unity-gain operational amplifier 58 to the output signal buss. Capacitors 59 and 60 perform a DC blocking function. Resistor 61 may be used to reduce the possibility of oscillation if very long leads acting as a capacitive load are placed on the output.

The components selected for the preferred embodiment are as follows: All operational amplifiers except operational amplifier 42 are one half of Fairchild type uA1458 or equivalent; other types may be used if higher slew rate, lower distortion, or higher signal-to-noise ratio is required. Operational amplifier 42 is one half of Fairchild type uA739 or equivalent; this type has been chosen for its low noise. Resistors 11 and 14 are 10k. Capacitors 12 and 13 are 10 mf, 16 v. Resistor 16 is 20k while resistor 17 is 10k; these values produce a voltage ratio of 0.3333, a reasonable margin below the approximately 0.36 ratio required to avoid overload within the signal matrix processor. Potentiometers 20*a* through 20*j* are 10k. Resistors 23*a* through 23*d* are 18k, resistors 24*a* through 24*i* are 7.5k, and resistors 25*a* through 25*j* are 3.3k. These values provide that the voltage at each of the outputs of operational amplifiers 22*b* through 22*i* will be equal to the voltage produced by the corresponding potentiometer 20*b* through 20*i* plus the voltage differences between that potentiometer and its adjacent potentiometers multipled by a factor of 0.44, and that the voltage at the outputs of operational amplifiers 22*a* and 22*j* will be equal to the voltage produced by the corresponding potentiometers 20*a* or 20*j* plus the voltage difference between that potentiometer and its adjacent potentiometer multiplied by a factor of 0.44 and the voltage difference between the potentiometer and the voltage midway between the input and output signal busses multiplied by a factor of 0.3666. The factor of 0.3666 shown here was chosen essentially empirically in combination with the parameters embodied by resistors 46 through 49, 52, and 53 and capacitors 50 and 51 to provide maximum accuracy in the extreme upper and lower frequency control bands.

The values for the resistors and capacitors forming the bandpass filters are as follows:
Resistors 34*a* and 35*a*: 43k
Resistors 34*b* and 35*b*: 22k
Resistors 34*c* and 35*c*: 22k
Resistors 34*d* and 35*d*: 11k
Resistors 34*e* and 35*e*: 12k
Resistors 34*f* and 35*f*: 13k
Resistors 34*g* and 35*g*: 3.0k
Resistors 34*h* and 35*h*: 3.3k
Resistors 34*i* and 35*i*: 3.6k
Resistors 34*j* and 35*j*: 3.9k
Capacitors 36*a* and 37*a*: 0.1 mf
Capacitors 36*b* and 37*b*: 0.1 mf
Capacitors 36*c* and 37*c*: 0.047 mf
Capacitors 36*d* and 37*d*: 0.047 mf
Capacitors 36*e* and 37*e*: 0.022 mf
Capacitors 36*f* and 37*f*: 0.01 mf
Capacitors 36*g* and 37*g*: 0.022 mf
Capacitors 36*h* and 37*h*: 0.01 mf
Capacitors 36*i* and 37*i*: 0.0047 mf
Capacitors 36*j* and 37*j*: 0.0022 mf
Resistor 38*a*: 110k
Resistor 38*b*: 56k
Resistor 38*c*: 56k
Resistor 38*d*: 27k
Resistor 38*e*: 30k
Resistor 38*f*: 33k
Resistor 38*g*: 7.5k
Resistor 38*h*: 8.2k
Resistor 38*i*: 9.1k
Resistor 38*j*: 10k These component values provided an average filter Q of approximately 1.125 with filter center frequencies located at 32 Hz and above on octave intervals within a tolerance of approximately minus 0 to plus 8.6 percent. Resistors 40*a* through 40*j* are 10k. Resistor 41 is 12k. Resistor 44 is 47 ohms and capacitor 45 is 0.0047 mf.

Resistors 46 and 47 are 13k. Resistor 48 is 39k. Resistor 49 is 22k. Capacitor 50 is 0.001 mf; capacitor 51 is 0.22 mf. Resistor 52 is 68k; resistor 53 is 11k. These values were chosen essentially empirically to provide accurate response in the lowermost and uppermost frequency bands. Resistor 56 is 20k; resistor 57 is 10k. Capacitors 59 and 60 are 47 mf 10 v. Resistor 61 has been set at zero ohms.

With the component values shown, the system has a signal-to-noise ratio of approximately 106 db with all gain controls set at mid position. The following accuracy specifications apply to most level control settings (with the exception of large amounts of gain boost or cut in the extreme end bands, and large changes in level settings between adjacent bands): Gain accuracy at the center of the frequency band in most cases is within one to three percent of the desired level. With all controls set to the same level, gain between band center points is uniform within two to three percent of the desired setting. When the controls are set to provide a continuous slope, an additional gain error between band center points of approximately seven to eight percent of the difference between adjacent band settings will be introduced. Lower Q values for the bandpass filters (with corresponding adjustment of signal matrix processor parameters) may be used to increase response curve smoothness and accuracy between band center points while somewhat reducing accuracy at band center points for some control settings.

In this embodiment, potentiometers have been used to set the gain in individual frequency bands. However, due to the design of the system, any device capable of providing a variable transfer function with respect to two input signals may be used to set system frequency response. These may include multiplying digital to analog converters, voltage controlled amplifiers, and others.

Where the invention is implemented using external control means (either analog or digital) to control the variable transfer function means used to set system response, the mathematical matrix operations required to generate signals appropriate to drive the bandpass filters may be performed on the external control signals as a part of the external control means, rather than within the feedback loop of the system.

In this case, the outputs of the variable transfer function means may be directly connected to the inputs of the bandpass filters, eliminating the need for the signal matrix processor within the feedback loop.

To accomplish this, the signals applied to the inputs of the bandpass filters generated by the variable transfer function means must be equivalent to the signals that would have been generated by the signal matrix processor as a function of the desired system control band responses.

Figure 5:
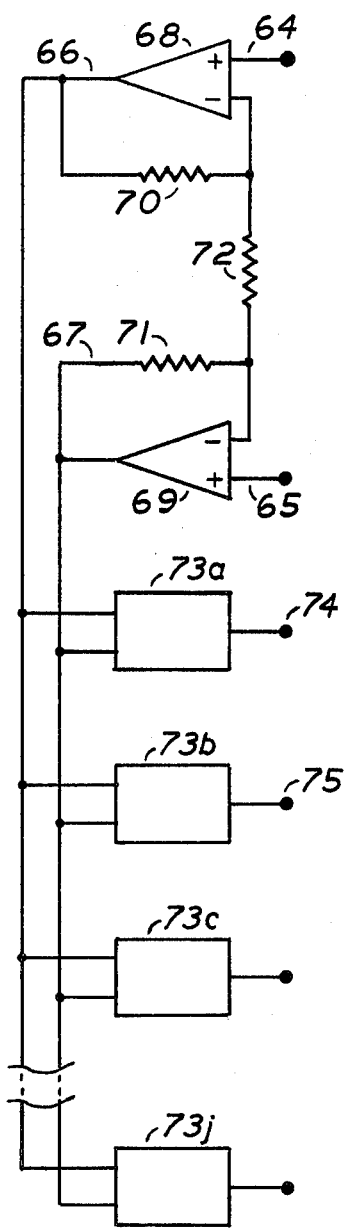
FIG. 5 is a schematic diagram of the components that may be added to the system as shown in FIG. 3 to provide a system capable of control by external control means.
Figure 6:
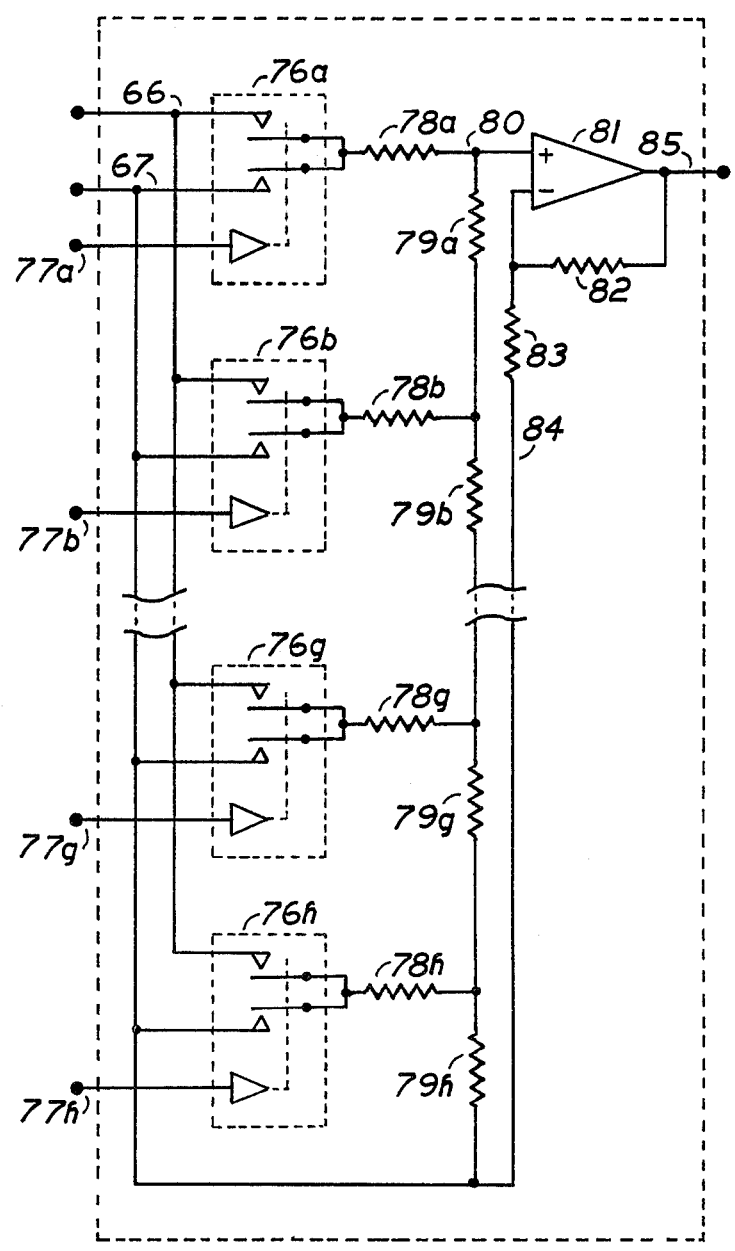
FIG. 6 is a detail illustration for FIG. 5.

FIG. 5 and FIG. 6 illustrate the additional components which may be added to the system as shown in FIG. 3 to implement an externally controlled frequency response controller in which the mathematical matrix functions are incorporated within the external control logic.

Points 64 and 65 in FIG. 5 are connected to the junction of resistors 16 and 17 and the junction of resistors 56 and 57 respectively in FIG. 3. Potentiometers 20a through 20j, resistors 23a through 23d, 24a through 24i, and 25a through 25j, and operational amplifiers 22a through 22j, 18 and 58 are eliminated.

The controllable variable transfer function means 73a through 73j are connected directly to the inputs of the ten bandpass filters at resistors 34a through 34j (point 74 connected to point 26, point 75 connected to point 27, and so on).

Operational amplifiers 68 and 69 generate, responsive to the signals present at points 64 and 65 representing the input and output busses, signals at points 66 and 67 appropriate to serve as inputs to the variable transfer function means 73a through 73j. A detailed illustration of one of the ten identical variable transfer function means is shown in FIG. 6.

Each of the variable transfer function means essentially functions as an 8-bit multiplying digital to analog converter. Elements 76a through 76h are eight SPDT FET analog switches, for which 77a through 77j are the digital control inputs. Input 77a is the most significant bit while input 77h is the least significant bit. Resistors 78a through 78h and 79a through 79h form the familiar R-2R ladder network commonly used in binary digital to analog converters.

Operational amplifier 81, in conjunction with resistors 82 and 83 essentially forms a voltage follower with a very small amount of differential gain sufficient to compensate for the 1-bit limitation at the end of the range of the ladder network.

The operation of the variable transfer function means is as follows. When, as a result of a binary input of zero to points 77a through 77h, in which all bits are zero, all switches are set to connect resistors 78a through 78h to point 67, the voltage at point 80 and also at point 85 will be equal to the voltage provided at point 67. When, as a result of a binary input of 255 to points 77a through 77h, in which all bits are one, all switches are set to connect resistors 78a through 78h to point 66, the voltage at point 80 will be equal to the voltage provided at point 66 multiplied by 255/256 plus the voltage at point 67 multiplied by 1/256.

Likewise, for any other binary input n between zero and 255 applied to inputs 77a through 77h, the voltage at point 80 will be equal to the voltage at point 66 multiplied by n/256 plus the voltage at point 67 multiplied by (256-n)/256.

The operation of operational amplifier 81 in conjunction with resistors 82 and 83 is such that the voltage at point 85 is equal to the voltage at point 80 plus the voltage difference between points 80 and 84 mutiplied by the ratio of resistor 82 divided by resistors 83. In this case, with the resistor values used, the voltage at point 85 is equal to the voltage at point 80 plus the voltage difference between points 80 and 84 multiplied by 1/255. Therefore, when, as a result of a binary input of 255 to points 77a through 77h, in which all bits are one, all switches are set to connect resistors 78a through 78h to point 66, the voltage at point 80 will be equal to the voltage provided at point 66.

Likewise, for any other binary input n between zero and 255 applied to inputs 77a through 77h, the voltage at point 85 will be equal to the voltage at point 66 multiplied by n/255 plus the voltage at point 67 multiplied by (255-n)/255.

The range of output voltages available from variable transfer function means 73a through 73j is limited to the range of voltages existing at point 66 to point 67; therefore, operational amplifiers 68 and 69 must provide output voltages equal in magnitude to the maximum signals that would otherwise be produced by the signal matrix processor. The parameters established for the signal matrix processor shown above provide that each output voltage will be equal to its corresponding input voltage plus the differences between that input voltage and the adjacent input voltages multiplied by 0.44. The maximum levels produced by the signal matrix processor occur when one control is set to one extreme and both adjacent controls are set to the other extreme; as, for example, when one control is set for maximum gain while its two adjacent controls are set for minimum gain. In this case, the voltage produced by the signal matrix processor for that control band is equal to the voltage present on the input buss plus the voltage difference between the input signal buss and the output signal buss mutiplied by 0.88.

The components selected for use are as follows. Operational amplifiers 68 and 69 are each one half of Fairchild type uA1458 or equivalent. Resistors 70 and 71 are 3.3k; resistor 72 is 3.75k, consisting of two 7.5k resistors in parallel. Analog switches 76a through 76h are Harris type HI5042 or equivalent. Resistors 78a through 78h are 200k. Resistors 79a through 79g are 100k; resistors 79h is 200k. Operational amplifier 81 is one half of Fairchild type uA1458 or equivalent. Resistor 82 is 1k; resistor 83 is 255k, consisting of the series combination of a 240k resistor and a 15k resistor.

The mathematical operations required and the computer steps involved in an implementation of an external control system incorporating the mathematical matrix operations are shown below. The computer used is provided with a BASIC language processor. For simplicity, the desired control band gain settings will be provided in a BASIC data statement; however, these settings could be obtained from values stored in memory, from analog to digital converters connected to external controls, or from any other source. The computer output of control settings to the variable transfer function means will be performed by means of memory-mapped output, in which ten 8-bit output ports are located at hexadecimal addresses 8000 through 8090 (decimal addresses 32768 through 32912) at 16 byte intervals. For purposes of illustration, the separate mathematical operations required are performed as distinct program steps. In practice, some of the functions could be consolidated and some of the intermediate variables eliminated to provide a more compact program and reduce system memory requirements.

The computer program used is as follows:

```
10 DATA 0,+3,+3,0,-6,-12,-12,+12,-12,-6
20  DIM IA(10),IB(10),IC(10),ID(10),IE(10),IG(10),IH(10)
30 RESTORE: FOR I=1 to 10: READ IA(I): NEXT I
40 FOR I=1 TO 10
50 IB(I)=EXP(LOG(10)*IA(I)/20)
60 NEXT I
70 FOR I=1 to 10
80 IC(I)=IB(I)/(1+IB(I))
90 NEXT I
100 FOR I=1 TO 10
110 ID(I)=0.5+1.6709*(IC(I)-0.5)
120 NEXT I
130   IE(1)=ID(1)+0.44*(ID(1)-ID(2))+0.3666*(ID(1)-0.5)
140 FOR I=2 TO 9
150  IE(I)=ID(I)+0.44*(ID(I)-ID(I-1))+0.44*(Id(I)-ID(I+1))
160 NEXT I
170  IE(10)=ID(10)+0.44*(ID(10)-ID(9))+0.3666*(ID(10)-0.5)
180 FOR I=1 TO 10
190 IG(I)=0.5+0.3623*(IE(I)-0.5)
200 NEXT I
210 FOR I=1 TO 10
220 IH(I)=INT(0.5+IG(I)*255)
230 NEXT I
240 FOR I=1 TO 10
250 POKE 32768+16*(I-1), IH(I)
260 NEXT I
270 END
```

Line 10 is the data statement for the desired control band gains. Line 30 serves to read these values into the array IA. These are expressed in db. Lines 40 through 60 convert the gain values from db form to linear form in array IB; that is, 12 db represents a voltage gain of 3.9811, 6 db represents a gain factor of 1.9953, 0 db represents a gain factor of 1.0000, and so on. Lines 70 through 90 serve to convert the required gain from its form as a ratio expressed with respect to one into a ratio in array IC whose two elements have a sum equal to one; as, for example, the ratio of 4 to 1 expressed as 0.8 to 0.2, a form that more nearly corresponds to the mode of operation of the variable transfer function means, in which the total transfer function relative to two input points is equal to one. The mathematics required for this is as follows: where x represents the transfer function provided relative to the input signal buss, $1-x$ represents the transfer function provided relative to the output signal buss, and y represents system gain, it follows that $y=x/(1-x)$. Solving for x as a function of y, $$x/(1-x) = y$$
$$x = y(1-x)$$
$$x = y - xy$$
$$x + xy = y$$
$$x = y/(1+y)$$

The next step involved relates to adjustment of the effective control settings in anticipation of the additional inputs provided to to the scaling adder directly from the input and output signal busses as shown in FIG. 2. As explained above, if the effective relative transfer function of the additional inputs to the scaling adder with respect to the input and output signal busses is 0.3333, the transfer function required for a system gain of approximately 4 is equal to 100 percent of the signal present on the input signal buss plus 0 percent of the signal present on the output signal buss. This contrasts with the 80 percent to 20 percent ratio, respectively, that would be required in the absence of the additional scaling adder inputs. The system parameters shown here have been calculated to provide a gain range of plus 12 db to minus 12 db at the maximum and minimum control settings respectively. Lines 100 through 120 serve to convert the input level values from a range of 0.7992 to 0.2008 (produced in response to a range of plus 12 to minus 12 db) to a range of 1 to 0 in array ID.

Lines 130 through 170 serve to provide the mathematical matrix functions equivalent to those that would have been provided by the signal matrix processor in array IE. Specifically, each of the elements IE(2) through IE(9) is set equal to the corresponding element of ID plus the differences between that element and its adjacent elements multiplied by 0.44 (representing the k1 factor described above), thus performing a function equivalent to that provided by operational amplifiers 22b through 22i. Likewise, elements IE(1) and ID(10) are each set equal to the corresponding element of ID plus the differences between that element and its adjacent element multiplied by 0.44 (representing k1) and the difference between that element and a value representing the voltage midway between the input and output signal busses multiplied 0.3666 (representing the k2 factor described above), thus performing a function equivalent to that provided by operational amplifiers 22a and 22j. Lines 180 through 200 serve to reduce the range of the control values to a range of 0 to 1 in array IG, to correspond to the minimum and maximum transfer functions that may be provided by the variable transfer function means. Lines 210 through 230 serve to normalize the control range to 0 to 255 in array IH, corresponding to the binary input range of the variable transfer function means. Lines 240 to 260 serve to apply the actual control outputs to the output ports connected to the variable transfer function means.

In this disclosure, the basic configuration of the multiple band frequency response controller shown consists of a plurality of bandpass filters, the outputs of which are coupled to an operational amplifier by means of a scaling adder and the inputs of which are variably coupled to input and output signals by means of variable transfer function means.

However, other circuit configurations may be employed to achieve similar results. An example of such a circuit is found in U.S. Pat. No. 4,046,960, in which system frequency response is established by providing variable impedance coupling of a plurality of series-resonant circuits, each of which provides a frequency-dependent impedance to ground, to the inverting and non-inverting inputs of an operational amplifier.

The external control means shown herein may be readily adapted for use with this type of frequency response controller. As an example, the eight SPDT FET switches shown used to generate a controllable variable voltage transfer function in conjunction with the R-2R resistor network of FIG. 6 may be used in conjunction with an R-2R-4R-8R . . . 256R resistor network to provide externally controllable variable impedance coupling for a series-resonant circuit in a frequency response controller of this type. In this case, the R resistor is connected between the common point of the switch representing the most significant bit and the series resonant circuit while the 256R resistor is connected between the common point of the switch representing the least significant bit and the series resonant circuit, and so on, with the other points of the switches connected to the inverting and non-inverting inputs of the operational amplifier, whereby the control signals applied to the switches serve to provide variable coupling between the series resonant circuits and the inputs of the operational amplifier, and in which setting all switches to connect their respective resistors to the non-inverting input will provide minimum pain, while setting all switches to provide to connect their respective resistors to the inverting input will provide maximum gain.

In such a system, the mathematical matrix operations required will be equivalent to those of the bandpass filter system shown above, differing only in that the elements of matrix G will be computed based on the real conductance components of the plurality of series-resonant circuits (adding the resistive component represented by the effective resistance of the resistor network).

In this disclosure, a number of examples have been offered to illustrate the invention. Although the examples shown here have generally provided for symmetrical gain increase and decrease, the principles disclosed herein are equally applicable to frequency response controllers providing only gain increase or only gain decrease. In this mode of operation, the variable transfer function means need only supply a variable transfer function with respect to either the input signal buss or the output signal buss, respectively.

Also, the examples have generally shown a plurality of variable transfer function means used to set system response. However, due to the design of the system, the use of a single variable transfer function element, operating in a multiplexed or "time-shared" mode (switched at a rate much higher than the highest response frequency of interest) is also feasible and is within the scope of the present invention.

The essence of the invention consists of providing to a plurality of bandpass elements within a feedback system signals appropriate to cause that system as a whole to generate smooth, accurate response curves, the generation of those signals being based on the mathematical matrix functions of the filter group. Any system embodying this concept will fall within the scope of the invention.

I claim:

1. A multiple band frequency response controller comprising:
    (a) operational amplifier means;
    (b) input means;
    (c) a plurality of variable transfer function means, the inputs of which are operatively connected to said input means and an output of said operational amplifier means;
    (d) a plurality of first scaling adder means, the inputs of which are operatively connected to the outputs of said variable transfer function means;
    (e) a plurality of bandpass filter means, the inputs of which are operatively connected to the outputs of said first scaling adder means;
    (f) a second scaling adder means, inputs of which are operatively connected to the outputs of said bandpass filter means and an output of which is operatively connected to an input of said operational amplifier means; and
    (g) output means, operatively connected to an output of said operational amplifier means.

2. The multiple band frequency response controller of claim 1 further comprising:
    (a) voltage divider means, the inputs of which are operatively connected to said input means and an output of said operational amplifier means; and
    (b) low pass filter means and high pass filter means, the inputs of which are operatively connected to at least one output of said voltage divider means and the outputs of which are operatively connected to inputs of said second scaling adder means.

3. A multiple band frequency response controller comprising:
    (a) operational amplifier means;
    (b) input means;
    (c) a plurality of variable transfer function means, the inputs of which are operatively connected to at least one of said input means and an output of said operational amplifier means;
    (d) a plurality of first scaling adder means, the inputs of which are operatively connected to the outputs of said variable transfer function means;
    (e) a plurality of bandpass filter means, the inputs of which are operatively connected to the outputs of said first scaling adder means;
    (f) a second scaling adder means, inputs of which are operatively connected to the outputs of said bandpass filter means and an output of which is operatively connected to an input of said operational amplifier means;

(g) first voltage divider means, the inputs of which are operatively connected to said input means and an output of said operational amplifier means and an output of which is operatively connected to an input of said second scaling adder means; and (h) output means, operatively connected to an output of said operational amplifier means.

4. The multiple band frequency response controller of claim 3 further comprising:

(a) second voltage divider means, the inputs of which are operatively connected to said input means and an output of said operational amplifier means; and (b) low pass filter means and high pass filter means, the inputs of which are operatively connected to at least one output of said second voltage divider means and the outputs of which are operatively connected to inputs of said second scaling adder means.

5. The multiple band frequency response controller of claim 1, claim 2, claim 3, or claim 4, wherein the input coefficients of said plurality of first scaling adder means are substantially proportional to the elements of a matrix which is the inverse matrix of the matrix consisting of the real response components of said plurality of bandpass filter means at the various center frequencies of said plurality of bandpass filter means, thereby system response at each of said band center frequencies is caused to substantially conform to the desired system response level represented by the transfer function of each of said plurality of variable transfer function means.

6. The multiple band frequency response controller of claim 1, claim 2, claim 3, or claim 4 wherein, where $I(i)$ refers to the signal generated by said variable transfer function means (i) and imparted upon input (i) of said plurality of first scaling adder means, where $O(i)$ refers to the signal generated at output (i) of said plurality of first scaling adder means and imparted upon said bandpass filter means (i), where k represents a selected factor, and where n represents the number of control bands, the operation of said plurality of first scaling adder means is such that, for $i = 2$ to $n-1$, $$O(i) = I(i) + k(I(i) - I(i-1)) + k(I(i) - I(i+1)),$$

for $i = 1$, $$O(1) = I(1) + k(I(1) - I(2)),$$

and, for $i = n$, $$O(n) = I(n) + k(I(n) - I(n-1)),$$

whereby system response at each of said band center frequencies is caused to substantially conform to the desired system response level represented by the transfer function of each of said plurality of variable transfer function means.

7. The multiple band frequency response controller of claim 2 or claim 4 wherein, where $I(i)$ refers to the signal generated by said variable transfer function means (i) and imparted upon input (i) of said plurality of first scaling adder means, where $O(i)$ refers to the signal generated at output (i) of said plurality of first scaling adder means and imparted upon said bandpass filter means (i), where A represents the signal present on said input means and B represents the signal present on said output means, where k1 represents a first selected factor, where k2 represents a second selected factor, and where n represents the number of control bands, the operation of said plurality of first scaling adder means is such that, for $i = 2$ to $n-1$, $$O(i) = I(i) + k1(I(i) - I(i-1)) + k1(I(i) - I(i+1)),$$

for $i = 1$, $$O(1) = I(1) + k1(I(1) - I(2)) + k2(I(1) - (A+B)/2),$$

and, for $i = n$, $$O(n) = I(n) + k1(I(n) - I(n-1)) + k2(I(n) - (A+B)/2),$$

whereby system response at each of said band center frequencies is caused to substantially conform to the desired system response level represented by the transfer function of each of said plurality of variable transfer function means.

8. A multiple band frequency response controller comprising:

(a) operational amplifier means;

(b) input means;

(c) a plurality of variable transfer function means, the inputs of which are operatively connected to said input means and an output of said operational amplifier means;

(d) a plurality of bandpass filter means, the inputs of which are operatively connected to the outputs of said variable transfer function means;

(e) scaling adder means, inputs of which are operatively connected to the outputs of said bandpass filter means and an output of which is operatively connected to an input of said operational amplifier means;

(f) output means, operatively connected to an output of said operational amplifier means; and (g) control means, comprising computing means operatively connected to said plurality of variable transfer function means, wherein the control signals applied to said plurality of variable transfer function means are determined by said computing means by the process comprising the step of multiplying the matrix representing the desired system response levels at the band center frequencies of said plurality of bandpass filter means by a multiplier matrix which is substantially proportional to the matrix which is the inverse of the matrix representing the real response components of each of said bandpass filter means at the various center frequencies of said plurality of bandpass filter means, whereby system response at each of said band center frequencies is caused to substantially conform to said desired system response levels.

9. The multiple band frequency response controller of claim 8 further comprising:

(a) voltage divider means, the inputs of which are operatively connected to said input means and an output of said operational amplifier means; and (b) low pass filter means and high pass filter means, the inputs of which are operatively connected to at least one output of said voltage divider means and the outputs of which are operatively connected to inputs of said scaling adder means.

10. A multiple band frequency response controller comprising:
   (a) operational amplifier means;
   (b) input means;
   (c) a plurality of variable transfer function means, inputs of which are operatively connected to at least one of said input means and an output of said operational amplifier means;
   (d) a plurality of bandpass filter means, the inputs of which are operatively connected to the outputs of said variable transfer function means;
   (e) scaling adder means, inputs of which are operatively connected to the outputs of said bandpass filter means and an output of which is operatively connected to an input of said operational amplifier means;
   (f) first voltage divider means, the inputs of which are operatively connected to said input means and an output of said operational amplifier means and an output of which is operatively connected to an input of said scaling adder means;
   (g) output means, operatively connected to an output of said operational amplifier means; and
   (h) control means, comprising computing means operatively connected to said plurality of variable transfer function means, wherein the control signals applied to said plurality of variable transfer function means are determined by said computing means by the process comprising the step of multiplying the matrix representing the desired system response levels at the band center frequencies of said plurality of bandpass filter means by a multiplier matrix which is substantially proportional to the matrix which is the inverse of the matrix representing the real response components of each of said bandpass filter means at the various center frequencies of said plurality of bandpass filter means, whereby system response at each of said band center frequencies is caused to substantially conform to said desired system response levels.

11. The multiple band frequency response controller of claim 10 further comprising:
   (a) second voltage divider means, the inputs of which are operatively connected to said input means and an output of said operational amplifier means; and
   (b) low pass filter means and high pass filter means, the inputs of which are operatively connected to at least one output of said second voltage divider means and the outputs of which are operatively connected to inputs of said scaling adder means.

12. The multiple band frequency response controller of claim 8, claim 9, claim 10, or claim 11 in which said multiplier matrix is comprised of elements in which, where k represents a selected factor and where n represents the number of frequency control bands, diagonal matrix elements (1,1) through (n,n) are equal to $1+2k$, diagonal elements (1,2) through (n-1,n) and (2,1) through (n,n−1) are equal to $-k$, and all other elements are equal to zero.

13. The multiple band frequency response controller of claim 8, claim 9, claim 10, or claim 11 in which said multiplier matrix is comprised of elements in which, where k1 represents a first selected factor, where k2 represents a second selected factor, and where n represents the number of frequency control bands, diagonal matrix elements (2,2) through (n−1,n−1) are equal to $1+2k1$, elements (1,1) and (n,n) are equal to $1+k1+k2$, and diagonal elements (1,2) through (n−1,n) and (2,1) through (n,n−1) are equal to $-k1$, and all other elements are equal to zero.

14. A multiple band frequency response controller comprising:
   (a) operational amplifier means;
   (b) input means;
   (c) means capable of generating signals responsive to the signals present on at least one of said input means and an output of said operational amplifier means;
   (d) a plurality of variable transfer function means, at least one of the inputs of each of which is operatively connected to at least one output of said signal generating means;
   (e) a plurality of bandpass filter means, the inputs of which are operatively connected to the outputs of said variable transfer function means;
   (f) scaling adder means, inputs of which are operatively connected to the outputs of said bandpass filter means and an output of which is operatively connected to an input of said operational amplifier means;
   (g) output means, operatively connected to an output of said operational amplifier means; and
   (h) control means, comprising computing means operatively connected to said plurality of variable transfer function means, wherein the control signals applied to said plurality of variable transfer function means are determined by said computing means by the process comprising the step of multiplying the matrix representing the desired system response levels at the band center frequencies of said plurality of bandpass filter means by a multiplier matrix which is substantially proportional to the matrix which is the inverse of the matrix representing the real response components of each of said bandpass filter means at the various center frequencies of said plurality of bandpass filter means, whereby system response at each of said band center frequencies is caused to substantially conform to said desired system response levels.

15. The multiple band frequency response controller of claim 14 further comprising:
   (a) voltage divider means, the inputs of which are operatively connected to said input means and an output of said operational amplifier means; and
   (b) low pass filter means and high pass filter means, the inputs of which are operatively connected to at least one output of said voltage divider means and the outputs of which are operatively connected to inputs of said scaling adder means.

16. The multiple band frequency response controller of claim 14 further comprising voltage divider means, the inputs of which are operatively connected to said input means and an output of said operational amplifier means and an output of which is operatively connected to an input of said scaling adder means.

17. The multiple band frequency response controller of claim 14 further comprising:
   (a) first voltage divider means, the inputs of which are operatively connected to said input means and an output of said operational amplifier means; and
   (b) low pass filter means and high pass filter means, the inputs of which are operatively connected to at least one output of said first voltage divider means and the outputs of which are operatively connected to inputs of said scaling adder means; and (c) second voltage divider means, the inputs of which are operatively connected to said input means and an output of said operational amplifier means and an output of which is operatively connected to an input of said scaling adder means.

18. The multiple band frequency response controller of claim 14, claim 15, claim 16, or claim 17 in which said multiplier matrix is comprised of elements in which, where k represents a selected factor and where n represents the number of frequency control bands, diagonal matrix elements (1,1) through (n,n) are equal to $1+2k$, diagonal elements (1,2) through (n−1,n) and (2,1) through (n,n−1) are equal to −k, and all other elements are equal to zero.

19. The multiple band frequency response controller of claim 14, claim 15, claim 16, or claim 17 in which said multiplier matrix is comprised of elements in which, where k1 represents a first selected factor, where k2 represents a second selected factor, and where n represents the number of frequency control bands, diagonal matrix elements (2,2) through (n−1,n−1) are equal to $1+2k1$, elements (1,1) and (n,n) are equal to $1+k1+k2$, diagonal elements (1,2) through (n−1,n) and (2,1) through (n,n−1) are equal to −k1, and all other elements are equal to zero.

20. A multiple band frequency response controller having a plurality of frequency control bands, each of which includes frequency band selective means in combination with a band response control, said band response controls being operatively controlled by control means, said control means comprising computing means characterized in that:

the control signals applied to said plurality of band response controls by said control means are determined by said computing means by the process comprising the step of multiplying the matrix representing the desired system response levels at the band center frequencies of said plurality of frequency control bands by a multiplier matrix which is substantially proportional to the matrix which is the inverse of the matrix representing the real response components of said frequency band selective means of each of said frequency control bands at the various center frequencies of said plurality of frequency band selective means, whereby system response at each of said band center frequencies is caused to substantially conform to said desired system response levels.

21. The multiple band frequency response controller of claim 20 in which said multiplier matrix is comprised of elements in which, where k represents a selected factor and where n represents the number of frequency control bands, diagonal matrix elements (1,1) through (n,n) are equal to $1+2k$, diagonal elements (1,2) through (n−1,n) and (2,1) through (n,n−1) are equal to −k, and all other elements are equal to zero.

22. The multiple band frequency response controller of claim 20 in which said multiplier matrix is comprised of elements in which, where k1 represents a first selected factor, where k2 represents a second selected factor, and where n represents the number of frequency control bands, diagonal matrix elements (2,2) through (n−1,n−1) are equal to $1+2k1$, elements (1,1) and (n,n) are equal to $1+k1+k2$, diagonal elements (1,2) through (n−1,n) and (2,1) through (n,n−1) are equal to −k1, and all other elements are equal to zero.

* * * * *